(12) United States Patent
Gaerditz et al.

(10) Patent No.: US 8,734,196 B2
(45) Date of Patent: May 27, 2014

(54) METHOD FOR PRODUCING AN ORGANIC RADIATION-EMITTING COMPONENT AND ORGANIC RADIATION-EMITTING COMPONENT

(75) Inventors: Christoph Gaerditz, Regensburg (DE); Ralph Paetzold, Roth (DE); Wiebke Sarfert, Herzogenaurach (DE); Oliver Weiss, Dossenheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 399 days.

(21) Appl. No.: 13/128,375

(22) PCT Filed: Oct. 16, 2009

(86) PCT No.: PCT/DE2009/001446
§ 371 (c)(1),
(2), (4) Date: Aug. 8, 2011

(87) PCT Pub. No.: WO2010/051789
PCT Pub. Date: May 14, 2010

(65) Prior Publication Data
US 2012/0126689 A1    May 24, 2012

(30) Foreign Application Priority Data
Nov. 7, 2008 (DE) .......................... 10 2008 056 370

(51) Int. Cl.
*H05B 33/00* (2006.01)

(52) U.S. Cl.
USPC ........................................... 445/23; 313/504

(58) Field of Classification Search
USPC .................. 313/504; 427/168; 445/24, 23, 25
See application file for complete search history.

(56) References Cited

U.S. PATENT DOCUMENTS

| | | |
|---|---|---|
| 2004/0212296 A1 | 10/2004 | Nakamura et al. |
| 2006/0007552 A1 | 1/2006 | Takakuwa |
| 2007/0013291 A1 | 1/2007 | Cok et al. |
| 2007/0241668 A1 | 10/2007 | Ottermann et al. |
| 2007/0257608 A1 * | 11/2007 | Tyan et al. .................... 313/506 |
| 2008/0018231 A1 | 1/2008 | Hirakata |
| 2008/0048557 A1 | 2/2008 | Birnstock et al. |
| 2008/0165315 A1 | 7/2008 | Nishida et al. |

FOREIGN PATENT DOCUMENTS

| | | |
|---|---|---|
| CN | 1719955 | 1/2006 |
| CN | 1947277 | 4/2007 |
| CN | 101019250 | 8/2007 |
| CN | 101030627 | 9/2007 |
| DE | 10 2004 020 245 | 12/2005 |
| DE | 10 2004 035 965 | 7/2007 |
| DE | 10 2007 006 348 | 6/2008 |
| EP | 1 830 421 | 9/2007 |
| JP | 2004-063209 | 2/2004 |
| JP | 2006-023683 | 1/2006 |
| JP | 2006-222028 | 8/2006 |
| WO | WO 2007/051499 | 5/2007 |
| WO | WO 2007/139209 | 12/2007 |
| WO | WO 2008/069219 | 6/2008 |

* cited by examiner

*Primary Examiner* — Joseph L Williams
(74) *Attorney, Agent, or Firm* — Cozen O'Connor

(57) ABSTRACT

A method for producing an organic radiation-emitting component is provided, comprising the following steps: A) providing an organic radiation-emitting layer sequence (10) having at least one organic functional layer (3), which is suited to emit electromagnetic radiation during operation, and a transparent layer (11), B) applying a transparent radiation decoupling layer (20) having a surface structure (21) onto a surface (12) of the transparent layer (11) facing away from the at least one functional layer (3) by means of spray coating. Furthermore, an organic radiation-emitting component is provided.

16 Claims, 5 Drawing Sheets

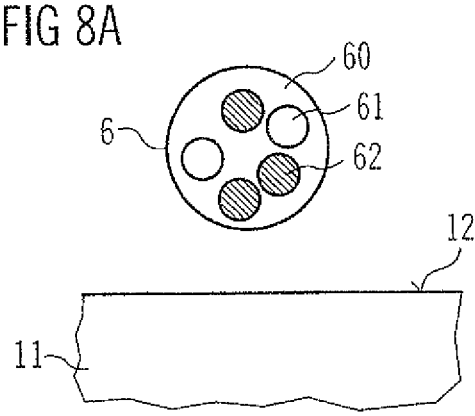
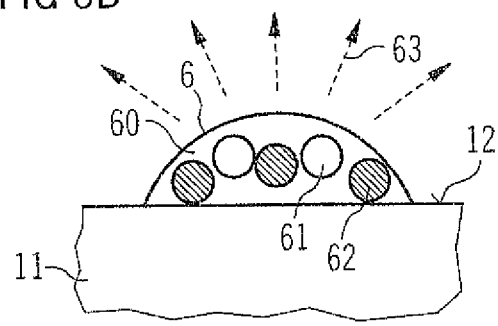
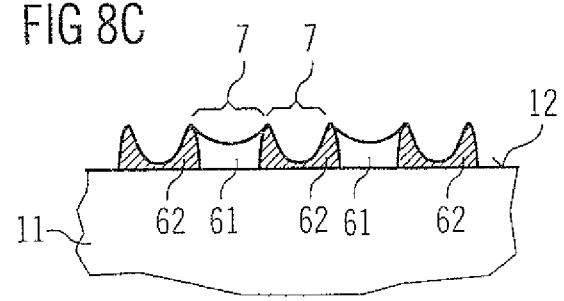

METHOD FOR PRODUCING AN ORGANIC RADIATION-EMITTING COMPONENT AND ORGANIC RADIATION-EMITTING COMPONENT

RELATED APPLICATIONS

This application is a U.S. National Phase Application under 35 USC 371 of International Application No. PCT/DE2009/001446 filed on Oct. 16, 2009.

This patent application claims the priority of German patent application 10 2008 056 370.6 filed Nov. 7, 2008, the disclosure content of which is hereby incorporated by reference.

FIELD OF THE INVENTION

A method for producing an organic radiation-emitting component and an organic radiation-emitting component are specified.

BACKGROUND OF THE INVENTION

Organic light-emitting diodes (OLEDs) for illumination and signaling purposes call for ever higher luminances with at the same time high efficiencies and lifetimes. In the case of known OLEDs attempts are made to achieve this by optimization and further development of the emitter materials and of the layer construction of the OLEDs.

SUMMARY OF THE INVENTION

At least one object of specific embodiments is to specify a method for producing an organic radiation-emitting component comprising an organic radiation-emitting layer sequence. At least one further object of specific embodiments is to specify an organic radiation-emitting component comprising an organic radiation-emitting layer sequence.

A method for producing an organic radiation-emitting component in accordance with one embodiment comprises, in particular, the following steps:
A) providing an organic radiation-emitting layer sequence having at least one organic functional layer suitable for emitting electromagnetic radiation during operation, and a transparent layer,
B) applying a transparent radiation coupling-out layer having a surface structure on a surface of the transparent layer, which is remote from the at least one functional layer, by means of spray coating.

In this case, the fact that one layer or one element is arranged or applied "on" or "above" another layer or another element can mean here and hereinafter that said one layer or said one element is arranged directly in direct mechanical and/or electrical contact on the other layer or the other element. Furthermore, it can also mean that said one layer or said one element is arranged indirectly on or above the other layer or the other element. In this case, further layers and/or elements can then be arranged between said one layer and the other layer or between said one element and the other element.

The fact that one layer or one element is arranged "between" two other layers or elements can mean here and hereinafter that said one layer or said one element is arranged directly in direct mechanical and/or electrical contact or in indirect contact with one of the two other layers or elements and in direct mechanical and/or electrical contact or in indirect contact with the other of the two other layers or elements.

In this case, in the case of indirect contact, further layers and/or elements can then be arranged between said one and at least one of the two other layers or between said one and at least one of the two other elements.

The designations "radiation", "electromagnetic radiation" and "light" mean here and hereinafter electromagnetic radiation having at least one wavelength or one spectral component in an infrared to ultraviolet wavelength range. In particular, infrared, visible and/or ultraviolet light can be designated.

In the case of known OLEDs, the largest loss factors with regard to the efficiency can be given by the wave guiding of light within organic layers with a loss factor of approximately 40 to 50% and transparent layers such as, for instance, a glass substrate with a loss factor of approximately 20 to 30%, wherein the loss factors are relative to the total power of the light generated in the OLED. By means of the method described here it is possible to produce an organic radiation-emitting component which can at least partly reduce these loss factors. In this case, it is advantageously possible, in particular on account of the spray coating, to produce a suitable radiation coupling-out layer having a surface structure which increases the coupling-out of the electromagnetic radiation generated in the organic radiation-emitting layer sequence from the organic radiation-emitting component.

Furthermore, it can be possible that, by means of the method described here, an organic radiation-emitting component can be provided in which a large part of the light subjected to wave guiding in the case of known OLEDs can be coupled out and thus made useable. By way of example, the improved coupling-out can be brought about by light scattering processes at the surface structure of the radiation coupling-out layer.

The organic radiation-emitting component comprising the organic radiation-emitting layer sequence can, in particular, comprise an organic light-emitting diode (OLED) or be embodied as such. For this purpose, the organic radiation-emitting layer sequence provided in method step A can have the at least one organic functional layer which is formed as an active region and which is suitable for generating electromagnetic radiation during the operation of the organic electronic component by recombination of electrons and holes.

The organic radiation-emitting layer sequence provided in method step A can have a first electrode, for example, which is applied on a substrate or which is for example also provided as a film. The at least one organic functional layer or a plurality of functional layers composed of organic materials can be applied above the first electrode. In this case, the at least one organic functional layer or the plurality of functional layers can comprise, for example, electron transport layers, hole blocking layers, electroluminescent layers, electron blocking layers and/or hole transport layers or can be embodied as such. A second electrode can be applied above the organic functional layer or the plurality of organic functional layers.

By way of example, the substrate can comprise glass, quartz, plastic films, metal, metal films, silicon wafers or some other suitable substrate material. If the organic radiation-emitting component and, in particular, the organic radiation-emitting layer sequence is embodied as a so-called "bottom emitter", the electromagnetic radiation generated in the organic radiation-emitting layer sequence can be emitted through the substrate. For this purpose, the substrate can have a transparency to at least part of the electromagnetic radiation generated in the at least one organic functional layer. In particular, in this case, the substrate can be the transparent layer having the surface which is remote from the at least one organic functional layer and on which the radiation coupling-out layer is applied by spray coating in method step B.

In the bottom emitter configuration, the first electrode can furthermore also have a transparency to at least part of the electromagnetic radiation generated by the at least one organic functional layer. Therefore, the first electrode can also be the transparent layer within the meaning of the method described here, wherein the radiation coupling-out layer can then also be applied before the application of the first electrode between the substrate and the first electrode.

A transparent first electrode, which can be embodied as an anode and therefore serves as a hole-injecting material, can, for example, comprise a transparent conductive oxide or consist of a transparent conductive oxide. Transparent conductive oxides ("TCO" for short) are transparent conductive materials, generally metal oxides such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

The first electrode can furthermore comprise an organic electrically conductive material selected from a group formed by polyacetylene, polyphenylene, polythiophene, polypyrrole, polyvinyl and polyaniline and copolymers and mixtures thereof. Particularly preferably, the second layer can comprise polyethylene dioxythiophene ("PEDOT") and/or polyaniline ("PANI"). Furthermore, the first electrode can also comprise organic small molecules of one or a plurality of materials selected from a group formed by phenanthroline derivatives, imidazole derivatives, triazole derivatives, oxadiazole derivatives, phenyl-containing compounds, compounds comprising condensed aromatics, carbazole-containing compounds, fluorene derivatives, spirofluorene derivatives and pyridine-containing compounds and also combinations of at least two or more of the materials mentioned.

Furthermore, the first electrode can comprise nanoparticles for example in the form of carbon nanotubes and/or fullerenes. The organic small molecules and/or the nanoparticles can be embodied for example as doping of an electrically conductive or, in an undoped state, electrically insulating matrix material, by means of which the electrical conductivity of the matrix material can be increased.

The at least one organic functional layer or the plurality of organic functional layers can comprise organic polymers, organic oligomers, organic monomers, organic small, non-polymeric molecules ("small molecules") or combinations thereof. In particular, it can be advantageous if the organic radiation-emitting layer sequence has a functional layer embodied as a hole transport layer, in order to enable effective hole injection into an electroluminescent layer or an electroluminescent region. By way of example, tertiary amines, carbazole derivatives, conductive polyaniline or polyethylene dioxythiophene may prove to be advantageous as polymer materials for a hole transport layer. As small-molecule materials, by way of example N,N'-bis(3-methylphenyl)-N,N'-bis(phenyl)benzidine (TPD), N,N'-bis(naphthalene-1-yl)-N,N'-bis(phenyl)benzidine (NPB) or 4,4',4"-tris(N,N'-diphenylamino)triphenylamine (TDATA) can be applied by vapor deposition, which can comprise one or a plurality of the following materials as p-type dopant: an organic material such as, for instance, ($F_4TCNQ$), a halide such as, for instance, $FeCl_3$ or $SbCl_5$ or a metal oxide such as, for instance, $WO_3$.

Furthermore, it can be advantageous if the at least one functional layer is embodied as an active region comprising at least one electroluminescent layer. Examples of suitable materials for this purpose include polymeric materials which exhibit emission of radiation on account of fluorescence or phosphorescence, for example polyfluorene, polythiophene or polyphenylene or derivatives, compounds, mixtures or copolymers thereof. Examples of suitable small-molecule materials include tris(8-hydroxyquinoline)aluminum ($Alq_3$), tris[2-(2-pyridinyl)phenyl-C,N]-iridium ($Ir(ppy)_3$) or bis(4,6-difluorophenylpyridinato-N,C2)-picolinatoiridium (FIrpic). Depending on the materials in the functional layers, the first radiation generated can have individual wavelengths or ranges or combinations thereof from the ultraviolet to red spectral range.

The second electrode can be embodied as a cathode and therefore serve as electron-injecting material. Inter alia, in particular aluminum, barium, indium, silver, gold, magnesium, calcium or lithium and compounds, combinations and alloys thereof may prove to be advantageous as cathode material. Alternatively or additionally, the second electrode can also comprise one of the abovementioned TCOs or a multi-layer combination comprising metal and TCO layers. In particular, the cathode can also have a layer comprising an electron-injecting material such as, for instance, a metal or a metal compound having a low work function, for example Ba, Ca, Mg, LiF, CsF or NaF, and also a layer forming a top contact and comprising Al, Ag and/or Au for contact-making.

Additionally or alternatively, the second electrode can also be embodied in a transparent fashion and/or the first electrode can be embodied as a cathode and the second electrode as an anode. That means, in particular, that the organic radiation-emitting component and, in particular, the organic radiation-emitting layer sequence can also be embodied as a "top emitter". In this case, the transparent layer, on which, in method step B, the radiation coupling-out layer is applied by means of spray coating, can comprise or be the second transparent electrode.

The first and/or the second electrode can in each case be embodied in a large-area fashion. As a result, in the case of an organic radiation-emitting layer sequence embodied as an OLED, a large-area emission of the electromagnetic radiation generated can be made possible. In this case, "large-area" can mean that the organic radiation-emitting component and, in particular, the organic radiation-emitting layer sequence has an area of greater than or equal to a few square millimeters, preferably greater than or equal to one square centimeter, and particularly preferably greater than or equal to one square decimeter. Alternatively or additionally, the first and/or the second electrode can be embodied in a structured fashion at least in partial regions. As a result, a structured emission of the electromagnetic radiation generated can be made possible, for instance in the form of a display with pixels or in the form of pictograms.

Furthermore, the organic radiation-emitting component can have an encapsulation above the organic radiation-emitting layer sequence, in order to achieve for the electrodes and the organic layer sequence, for example, protection against moisture and/or oxidizing substances such as oxygen, for instance. In this case, the encapsulation can comprise one or a plurality of layers, wherein the layers of the encapsulation can be, for example, planarization layers, barrier layers, water- and/or oxygen-absorbing layers, connecting layers or combinations thereof. The encapsulation can comprise, for example a covering in the form of a cap, in particular a self-supporting cap, and/or a layer or layer sequence on or above the second electrode. Suitable materials can comprise or be, for example, glass, plastics, metals, metal oxides, non-metal oxides or non-metal nitrides such as, for instance, $SiO_x$ or $SiN_x$, ceramics or combinations thereof. Furthermore, the covering can also be embodied as a laminate. In particular, the encapsulation can also be transparent, particularly preferably in conjunction with an OLED embodied as a top emitter, such that the transparent layer, on which, in method step B, the radiation coupling-out layer is applied by means of spray coating, can comprise the encapsulation or can be formed by the latter.

The transparent layer can therefore comprise or be, for example, a transparent substrate, a transparent electrode and/or a transparent encapsulation.

"Spray coating" can denote here and hereinafter, in particular, a method in which a liquid is atomized to form small drops which, for example, can be applied to a surface by means of a nozzle. In particular, the drops can have an average size as a result of the atomization. The individual drops of the drop ensemble produced by the nozzle can have a size corresponding to a statistical distribution around the average size. In this case, the average size of the drops and also the statistical distribution of the drop sizes can be in the range of a few hundred nanometers and can be dependent on the method for atomizing the liquid and on properties of the liquid such as, for instance, the viscosity thereof and/or the constituents thereof in the form of materials and mixtures in a liquid phase, in the form of a solution, a suspension and/or an emulsion.

Furthermore, here and hereinafter, "liquid" can denote a material in a liquid phase and also a mixture or a solution composed of a plurality of materials in a liquid phase. Furthermore, a liquid can comprise or be a solution, suspension or emulsion of liquid and solid materials.

In the method described here, before method step B, a liquid is provided which comprises the materials to be applied by spray coating for the purpose of producing the radiation coupling-out layer and which comprises, in particular, as is described further below, nonvolatile materials which remain on the surface of the transparent layer of the organic radiation-emitting layer sequence. Furthermore, the liquid can also comprise further constituents, preferably volatile constituents, such as, for instance, one or a plurality of solvents and/or one or a plurality of liquid suspension media and/or one or a plurality of emulsifiers and/or one or a plurality of binders and/or further liquid materials.

In order to produce a radiation coupling-out layer that is as efficient as possible on the transparent layer of the organic radiation-emitting layer sequence, it may be necessary to produce the surface structure of the radiation coupling-out layer structures of an order of magnitude, that is to say with an area proportion on the surface of the transparent layer and/or with a height, of from approximately half a wavelength of the electromagnetic radiation generated in the organic radiation-emitting layer sequence to approximately three times the wavelength. Particularly preferably, the structures of the surface structure have a size of greater than or equal to approximately half a wavelength to one wavelength and less than or equal to one wavelength plus a few hundred nanometers. That can mean, for example, that the structures of the surface structure can have a size of greater than or equal to 200 nanometers and less than or equal to 1 micrometer.

In particular, the surface structure of the radiation coupling-out layer can have structures having an average size, wherein the respective sizes of the individual structures can have a statistical distribution, as described previously in conjunction with the statistical distribution of the size of the drops.

Furthermore, by means of an as far as possible irregular distribution of the structures and the sizes thereof, it is possible to avoid disturbing effects such as moiré effects, for instance, such as could be produced by excessively regular structures of the orders of magnitude mentioned. Therefore, by means of the spray coating, it can advantageously be possible to produce a radiation coupling-out layer having a surface structure which has structures having an as far as possible irregular spatial distribution. That can mean, in particular, that on average respectively adjacent structures of the surface structure are at an average distance from one another, wherein individual respectively adjacent structures can be at an actual distance from one another which corresponds to a widest possible statistical distribution as described previously in conjunction with the drop size.

Furthermore, the drops of the liquid which are sprayed onto the transparent layer in order to produce the radiation coupling-out layer can also have sizes which, after being applied to the surface by spray coating, have the size range mentioned in conjunction with the radiation coupling-out layer.

In contrast to spray coating, structures of the order of magnitude described above and in the size ranges described above cannot be produced, or can only be produced with great technical outlay, by means of other known structuring possibilities. Thus, structuring possibilities such as the roughening of surfaces by sandblasting or etching are generally known. By means of sandblasting, however, with reasonable technical outlay, it is only possible to produce structures which are far larger than the size ranges mentioned above. By means of etching, too, for example through etching masks, structures in the size ranges mentioned can be produced technically only with very great difficulty and outlay. Furthermore, these methods are removing methods that make stringent requirements on the process compatibility of the components to be processed. Furthermore, applying methods such as, for instance, blade coating or printing are also known, in which, however, usually it is likewise not possible to produce structures which lie in the size ranges mentioned and which simultaneously have an irregular, statistical size distribution and spatial distribution, as is possible by means of spray coating. Other methods such as, for instance, applying already completed films having scattering structures using an optical gel or adhesive are indeed known, but such methods, besides the disadvantages mentioned above, are also very cost-intensive as a result of the additional process steps and materials.

In particular, in method step B, the radiation coupling-out layer can be applied by spray coating in the form of individual drops which can dry individually on the surface of the transparent layer to form the radiation coupling-out layer having the surface structure. Here and hereinafter, "drying" can denote a process in which a proportion of the liquid of a drop is removed by evaporation or volatilization from the drop on the surface and/or is bound to the surface or into the material of the transparent layer by reactive or absorptive effects, such that the remainder of the drop forms a solid residue on the surface. Those constituents of the liquid provided before method step B which do not remain as residue on the surface after drying can be designated here and hereinafter as "volatile constituents".

Here and hereinafter, "dry individually" can mean that a drop, after being sprayed onto the surface, dries in a manner virtually isolated from possible other drops on the surface, such that, in particular, on the surface a plurality of drops cannot combine to form a larger drop before drying.

Furthermore, in method step B, in particular a crosslinkable material in a liquid phase, a solution, a suspension or a combination thereof can be applied in the form of drops, wherein the radiation coupling-out layer having the surface structure is formed by means of drying and/or crosslinking of the material. In this case, the crosslinking can be effected by one or more chemical reactions of constituents of the drop with one another and/or with the surface, wherein the reaction after the application of a drop can be self-initiated by the materials and/or can be initiated externally by the action of heat, light, for instance UV light, or particle radiation, for instance electrons.

By way of example, the drops can dry individually on the surface and subsequently be jointly crosslinked and cured. As an alternative thereto, each drop can be crosslinked and cured independently of other drops during or after individual drying.

Furthermore, the drops can form residues during drying. In this case, the residues are formed by all the constituents of the liquid applied by spray coating which are not removed from the drops by drying, that is to say by all the nonvolatile constituents in accordance with the above description. In this case, diffusion of the nonvolatile constituents of the liquid applied as drops by spray coating can occur during drying. The diffusion can be brought about for example by differences in the surface tension of a drop applied by spray coating as a result of different drying rates in the drop. The different drying rates can be caused, for example, in the case of evaporating or volatilizing volatile constituents, by different evaporation rates in different regions of a drop. As a result, within a drying drop, a diffusion of liquid, that is to say volatile and nonvolatile constituents, from first regions having a low evaporation rate towards second regions having a higher evaporation rate can occur, as a result of which nonvolatile constituents can accumulate to an increased extent in the second regions. In the case of a drop applied by spray coating on the surface of the transparent layer, a first region having a low evaporation rate on account of a higher surface tension can be, for example a central region of the drop, while edge regions of the drop can be second regions having comparatively higher evaporation rates on account of a lower surface tension being able to be present there. Such diffusion effects can also be referred to as the so-called Marangoni or coffee stain effect.

The diffusion rate or speed within a drying drop can be adjustable for example by the mixing proportions of the volatile and nonvolatile constituents, their viscosities, polarities and/or by the evaporation properties such as, for instance, the boiling points of the volatile constituents and/or by their reaction properties with the surface of the transparent layer. If, by way of example, the constituents of a drop are selected in such a way that the viscosity of the drying drop increases only slowly during drying, the nonvolatile constituents can have enough time to diffuse into the abovementioned second regions, as a result of which a large accumulation or a larger residue of nonvolatile constituents in comparison with the first regions can occur in said second regions.

Particularly preferably, the drops can form during drying residues having a height profile having a prism-like, pyramid-like, meniscus-like or lens-like form or a combination thereof. That can mean that one drop alone can form such a form or else that two or more drops applied by spray coating in an adjacent fashion and dried individually can together form such a form. In particular, by way of example, two or more meniscus-like residues adjoining one another can form a pyramid- or prism-like structure in the region in which they adjoin one another.

Since, as described above, the drops can be sprayed with a statistical size distribution and a statistical spatial distribution irregularly on the surface of the transparent layer, the abovementioned forms can form the surface structure with structures likewise having an irregular distribution. Furthermore, drops can also be applied by spray coating in a partly or wholly overlapping fashion and thus in a manner partly or wholly over drops that have already been applied by spray coating and dried, as a result of which a further increase in the structures of the surface structure produced can be achieved by means of the effect described above.

Furthermore, as a result of the drying of the drops on the surface, it is possible to form residues in the form of structures having a ratio of the occupied area of each residue on the surface to its height ("aspect ratio", "base-area-to-height ratio") which, on average, is greater than or equal to 0.1, and particularly preferably greater than or equal to 0.15. If a prism- or pyramid-like form of one or a plurality of residues is assumed, then the form ideally has, particularly preferably, a vertex having an angle of approximately 90° or greater, wherein the vertex does not have to be shaped in a mathematically strict fashion, but rather can also be rounded, for example.

In method step B, the radiation coupling-out layer can be produced with a thickness of greater than or equal to 30 nanometers and less than or equal to 30 micrometers, and particularly preferably a thickness of greater than or equal to 300 nanometers and less than or equal to 3 micrometers. In this case, the thickness of the radiation coupling-out layer can be dimensioned from the surface of the transparent layer concomitantly to an average height of the surface structure above the surface of the transparent layer.

In particular, one or a plurality of materials from a group for producing the radiation coupling-out layer which is formed by acrylate, in particular a methacrylate and/or a methyl methacrylate, silicone, epoxide, polycarbonate and natural plastic such as, for instance, rubber and also precursors and/or combinations of the materials mentioned can be applied by spray coating. For this purpose, before the method step, as described above, it is possible to provide a liquid comprising monomers, oligomers and/or already partly crosslinked polymers of the materials mentioned in solution, suspension and/or emulsion. For this purpose, the materials mentioned can be present in liquid and/or solid form in the liquid and, particularly preferably, are crosslinkable and curable with the supply of energy such as, for instance, light, in particular UV light, and/or heat and/or by means of a chemical process.

In principle, all known liquids suitable for dissolving, suspending and/or emulsifying the abovementioned materials can serve as solvent, suspension medium and/or emulsifier.

By way of example, in method step B, a material which is vitreous with regard to its constitution and its optical properties can be applied by spray coating. That can mean that the radiation coupling-out layer has an amorphous, non-crystalline structure in a completed state. Alternatively, or additionally, it is also possible to apply a material which forms a crystalline or at least partly crystalline structure at least in the individual residues after the completion of the radiation coupling-out layer. The radiation coupling-out layer can therefore have, for example a crystalline or a polycrystalline structure.

Furthermore, in method step B, a material having a refractive index that is less than or equal to the refractive index of the transparent layer and greater than the refractive index of air can be applied by spray coating. By virtue of the radiation coupling-out layer comprising this material, it is possible to improve the coupling-out efficiency of the electromagnetic radiation generated in the organic radiation-emitting layer sequence by means of, for example, reducing total reflection at the interface between the transparent layer and the radiation coupling-out layer.

Furthermore, by way of example, at least two different materials can be applied by spray coating, which subsequently remain on the surface of the transparent layer. In this case, the at least two different materials can be applied from two different nozzles as solutions, suspension and/or emulsions or else alternatively from a single nozzle in a liquid phase, a suspension or an emulsion of solutions which are insoluble in one another. As a result, for example, during drying and/or, if appropriate, during curing, a phase separation of the at least two materials can occur, which can be utilized, for example, for the targeted setting of desired properties such as, for instance, laterally alternating optical properties of the radiation coupling-out layer.

Furthermore, method step B can comprise the following substeps:

B1) applying a first material by spray coating onto that surface of the transparent layer which is remote from the at least one functional layer, and B2) applying a second material to the first material by spray coating.

As a result, it is possible to produce the radiation coupling-out layer with at least two layers, wherein the first layer comprises the first material and the second layer comprises the second material. In this case, each of the layers, in accordance with the above description, can have a surface structure as a result of the drying of the drops of the first or respectively of the second material that are applied by spray coating. In this case, the first material and the second material can be identical or different. In addition, in further substeps of method step B, further materials can be applied successively on the second material.

In this case, the first material can have, for example, a refractive index that is less than or equal to the refractive index of the transparent layer and greater than the refractive index of the second material, while the refractive index of the second material is in turn greater than the refractive index of air. As a result of such a "refractive index cascade", it is possible to further increase the coupling-out efficiency of the electromagnetic radiation generated in the organic radiation-emitting layer sequence through the radiation coupling-out layer.

Furthermore, in method step B, a material for forming the radiation coupling-out layer can be applied which additionally comprises scattering particles. The scattering particles can be dispersed as volume scatters after the drying and, if appropriate, after the curing of the material in an abovementioned material serving as matrix material. In particular, the scattering particles can comprise, for example, a metal oxide, thus for instance titanium oxide or aluminum oxide, such as, for instance, corundum, and/or glass particles and/or plastic particles, which have a different refractive index than the matrix material. Furthermore, the scattering particles can have cavities and can be embodied for example in the form of hollow plastic spheres. In this case, the scattering particles can have diameters or grain sizes of less than one micrometer up to an order of magnitude of 10 micrometers or else up to 100 micrometers.

Furthermore, in method step B, the radiation coupling-out layer can be applied in a laterally structured fashion on the surface of the transparent layer. By way of example, in this case, the transparent layer and/or the organic radiation-emitting layer sequence can also be structured, for instance in the form of a display or an indication of pictograms. The laterally structured application of the radiation coupling-out layer can be effected, for example, by spray coating through a shadow mask. As an alternative thereto, the material for producing the radiation coupling-out layer can be applied by spray coating in a large-area fashion and subsequently be cured in a structured fashion, for example by means of a shadow mask or by means of a laser. None-cured material can subsequently be removed.

In method step B, the radiation coupling-out layer can be laterally structured for example in strip-shaped fashion, in reticulated or lattice-shaped fashion or in pixel-shaped fashion.

Furthermore, all combinations of the abovementioned materials, layers and arrangements or structures for producing the radiation coupling-out layer are also possible.

The method described here makes it possible to produce an organic radiation-emitting component in which a radiation coupling-out layer having a surface structure is produced which can couple out the electromagnetic radiation generated in the organic radiation-emitting layer sequence as efficiently as possible from the organic functional layers, a transparent electrode, a transparent substrate and/or a transparent encapsulation.

In particular, the method described here with the application of the radiation coupling-out layer by means of spray coating is readily scalable and can also be employed for large areas and affords the possibility of applying surfaces that are as rough as possible with roughnesses in the abovementioned size ranges rapidly, technically simply and in a large-area fashion. The material to be applied by spray coating can be freely selectable within the limits mentioned above. In particular, a change between two materials can also be effected very rapidly. By way of example, the abovementioned scattering particles or other solid materials that are in solution or suspension prior to spray coating are purely statistically distributed, which, as described above, can increase and optimize the scattering and coupling-out effect of the radiation coupling-out layer.

Moreover, it may be possible to apply the radiation coupling-out layer to the organic radiation-emitting layer sequence provided in method step A for example only after a quality control process for said layer sequence, which can lead to a lowering of the production costs. In this case, the radiation coupling-out layer can also be adapted to the quality of the organic radiation-emitting layer sequence.

Furthermore, the method described here, besides producing organic radiation-emitting components for illumination purposes, can also be advantageous for applications in the display sector. Since, as already described above, by means of the spray coating, drops in a suitably selected and set size range of preferably less than one micrometer can be applied to the surface of the transparent layer, individual pixels of an organic radiation-emitting component embodied as a display with typical dimensions of approximately 100 micrometers by 100 micrometers can be imaged sharply and without "jagging" of the pixel edges. If known microlenses were used here, for example, which usually cannot be produced smaller than with a typical diameter of approximately 30 micrometers, one edge of a pixel could lie directly in the center of a lens, while another edge terminates flush with a lens.

A similar effect would also be obtained with a scattering layer applied by blade coating, on account of the structure sizes usually attainable there. However, this would lead to a non-uniform and differing optical impression for an external observer and would therefore not be desirable. This disadvantage can be avoided precisely by virtue of the resolution attainable by the spray coating in the abovementioned size ranges, which is comparable rather with a high-resolution lithography method but without the additional complicated and cost-intensive method steps therefor.

In accordance with a further embodiment, an organic radiation-emitting component comprises, in particular, an organic radiation-emitting layer sequence having at least one organic functional layer suitable for emitting electromagnetic radiation during operation, and a transparent layer, and a radiation coupling-out layer on a surface of the transparent layer which is remote from the at least one functional layer, wherein the radiation coupling-out layer has a surface structure formed from residues of a plurality of individually dried drops.

In this case, the organic radiation-emitting component can be producible and furthermore produced by the above-described method, in particular. All features and combinations thereof, properties and advantages mentioned above in conjunction with the method for producing the organic radiation-emitting component are therefore also applicable to the organic radiation-emitting component. Conversely, all the features, feature combinations, properties and advantages mentioned here and hereinafter in conjunction with the organic radiation-emitting component are also applicable to the method mentioned above.

In particular, the radiation coupling-out layer can have residues having a size of less than or equal to 1 micrometer. Furthermore, the residues can have a prism-like, pyramid-like, meniscus-like form or a combination thereof. In this case, the residues can preferably have a height-to-base-area ratio of greater than or equal to 0.1, particularly preferably of greater than or equal to 0.15.

Furthermore, the radiation coupling-out layer can have a first layer comprising a first material and a second layer comprising a second material.

BRIEF DESCRIPTION OF THE DRAWINGS

FIGS. 8A to 8C show schematic illustrations of method steps in accordance with a further exemplary embodiment.

DETAILED DESCRIPTION OF THE DRAWINGS

In the exemplary embodiments and figures, identical or identically acting constituent parts can in each case be provided with the same reference symbols. The elements illustrated and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

Figure 1A:
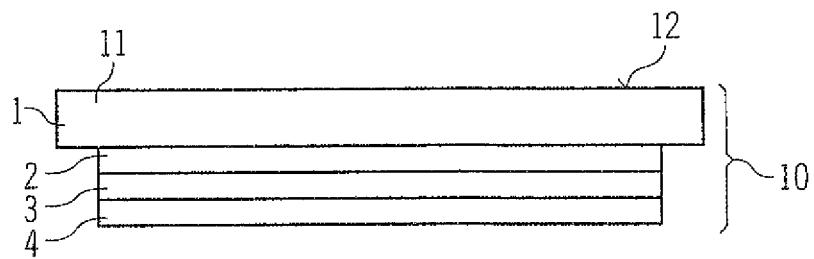
FIGS. 1A and 1B show schematic illustrations of method steps of a method for producing an organic radiation-emitting component in accordance with one exemplary embodiment.
Figure 1B:
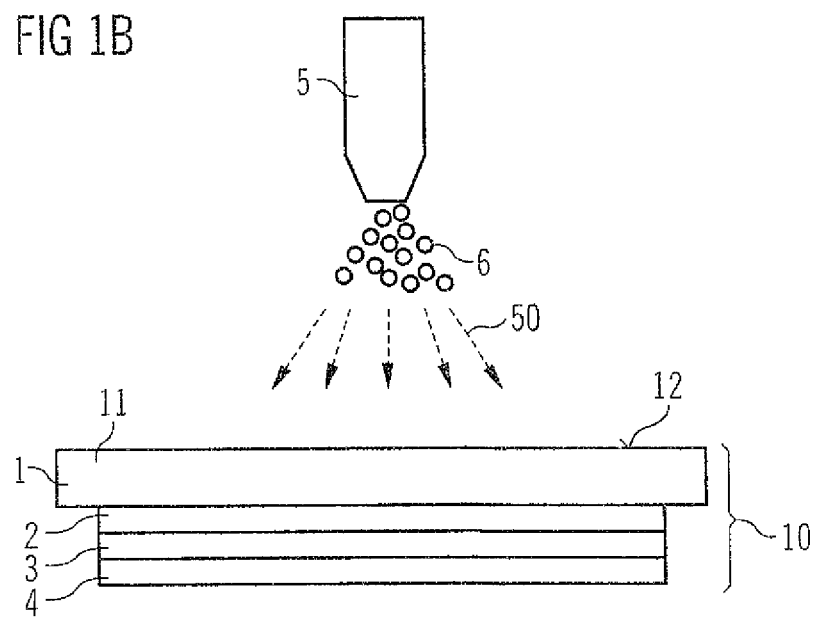

FIGS. 1A and 1B show method steps of a method for producing an organic radiation-emitting component in accordance with one exemplary embodiment.

In this case, in a first method step A in accordance with FIG. 1A, an organic radiation-emitting layer sequence 10 is provided. In the exemplary embodiment shown, the organic radiation-emitting layer sequence 10 is an organic light-emitting diode (OLED) embodied as a so-called bottom emitter. For this purpose, the organic radiation-emitting layer sequence 10 has a substrate 1, on which a first electrode 2, an organic functional layer 3 and a second electrode 4 are applied.

In the exemplary embodiment shown, the substrate 1 is formed from glass and is formed in a transparent fashion. The first electrode 2 is formed from indium tin oxide (ITO) and is formed as a transparent anode. The second electrode 4 comprises a metal having a low work function for electrons and is formed as a cathode comprising an aluminum layer in the exemplary embodiment shown.

The organic functional layer 3 comprises an organic electroluminescent material and is suitable for producing, during the operation of the organic radiation-emitting component to be produced, electromagnetic radiation by recombination of electrons and holes which are injected into the organic functional layer 3 respectively by the second electrode 4 and by the first electrode 2. In addition to the organic functional layer 3 shown, the organic radiation-emitting layer sequence 10 can also have further organic functional layers, for instance one or a plurality of hole transport layers and/or one or a plurality of electron transport layers and/or one or a plurality of charge carrier blocking layers, which are not illustrated for the sake of clarity.

The organic radiation-emitting layer sequence 10 has a transparent layer 11, which, in the exemplary embodiment shown, is formed by the substrate 1 and which has a surface 12 remote from the at least one functional layer 3. From the surface 12 of the transparent layer 11, the electromagnetic radiation generated in the organic functional layer 3 can be emitted from the organic radiation-emitting layer sequence 10.

The organic radiation-emitting layer sequence 10 shown here and hereinafter should be interpreted purely by way of example and non-restrictively with regard to its embodiment. As an alternative or in addition to the exemplary embodiment shown, the organic radiation-emitting layer sequence 10 can have an alternative layer construction and/or materials as described in the general part, and also an encapsulation. As an alternative to the exemplary embodiment shown, the organic radiation-emitting layer sequence 10 can also be embodied as a so-called top emitter, in which the transparent layer 11 is formed by the electrode 4 remote from the substrate 1 and/or by an encapsulation (not shown).

The following method steps and exemplary embodiments relate equally to an organic radiation-emitting layer sequence 10 embodied as a large-area illumination device or as a structured indicator such as, for instance, a display.

FIG. 1B shows a further method step B, in which a liquid is sprayed onto the surface 12 of the transparent layer 11. For this purpose, a nozzle 5 is provided, which sprays the liquid in the form of drops 6 along a spraying direction, which is indicated by the arrows 50, on the surface 12.

The size of the individual drops 6 is thereby given by a statistical distribution of drop sizes around an average size and is dependent on the nozzle 5 and also on the properties of the liquid. Through a suitable choice of the nozzle parameters such as, for instance, the size of the nozzle opening and/or the exit speed of the drops 6 from the nozzle opening in conjunction with properties of the liquid such as, for instance, the viscosity thereof and/or the constituents thereof in the form of materials and mixtures in a liquid phase, in the form of a solution, a suspension and/or an emulsion, a desired size range and a desired size distribution of the drops can be set. In the exemplary embodiment shown, the individual drops preferably have a size and, in particular, a diameter of greater than or equal to 200 nanometers and less than or equal to 1 micrometer.

FIGS. 2A to 2D show substeps and further features of method step B on the basis of a drop 6 shown purely by way of example. In this case, FIGS. 2A to 2D each show an excerpt from the organic radiation-emitting layer sequence 10 from FIGS. 1A and 1B in which only the transparent layer 11 is illustrated.

Figure 2A:
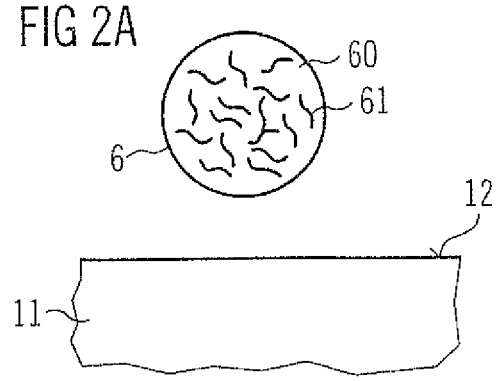
FIGS. 2A to 2D show schematic illustrations of substeps of a method step in accordance with the exemplary embodiment.

In this case, FIG. 2A shows the drop 6 shortly before it impinges on the surface 12 of the transparent layer 11. The drop 6 comprises a material 61 dissolved in a liquid medium 60. In the exemplary embodiment shown, the material 61 is a transparent acrylate-based plastic present in the form of monomers, oligomers and/or partly crosslinked polymers, said plastic being dissolved in the liquid material 60 embodied as a solvent. Furthermore, the material 61 and/or the liquid medium 60 can comprise further constituents and auxiliaries which can improve the solubility of the material 61 in the liquid medium 60 and/or the crosslinkability of the material 61 and which are known to the person skilled in the art from resists, for example.

As an alternative thereto, the material 61 can also itself be present in a liquid phase with or without the liquid medium 60 and/or form a suspension or emulsion with the liquid medium. The material 61 can furthermore alternatively or additionally comprise one or more of the materials and/or properties mentioned in the general part.

In the present exemplary embodiment, therefore, the drop 6 comprises the liquid medium 60 as volatile constituent and the material 61 as nonvolatile constituent.

Figure 2B:
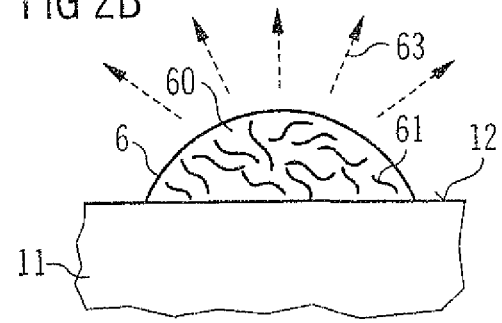
Figure 2C:
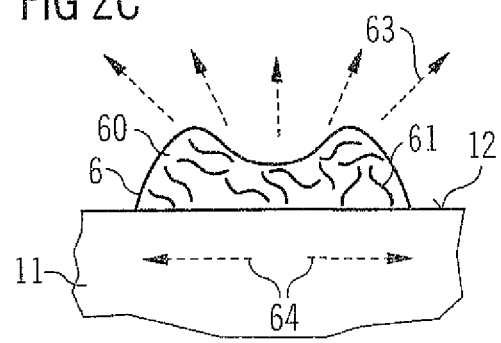

FIG. 2B shows the drop 6 shortly after it impinges on the surface 12 of the transparent layer 11. On account of the surface tension of the drop 6, in this case a characteristic curvature of the drop 6 is established on the surface 12. In this case, the evaporation rate of the liquid medium 60 is also determined by the surface tension of the drop 6. As a result of the evaporation of the liquid medium 60, which is indicated by the arrows 63, the drop 6 dries within the meaning of the description in the general part individually and independently of further drops applied to the surface 12 by spray coating.

In the exemplary embodiment shown, the constituents of the drop 6 are chosen in such a way that the volatilization or evaporation rate of the liquid medium 60 is higher in the edge regions of the drop 6 on the surface 12 than in the center of the drop 6. As a result, the liquid medium 6 volatilizes more rapidly in the edge regions of the drop 6 than in the center, as a result of which liquid medium 60 subsequently flows from the center to the edge regions and a diffusion movement of the material 61 dissolved in the liquid medium 60 is brought about, which is indicated by the arrows 64 in FIG. 2C. In the course of the drying process for the drop 6, therefore, a larger amount of the material 61 accumulates in the edge regions of the drop 6 in comparison with the center, which can also be referred to as the so-called Marangoni or coffee stain effect.

Figure 2D:
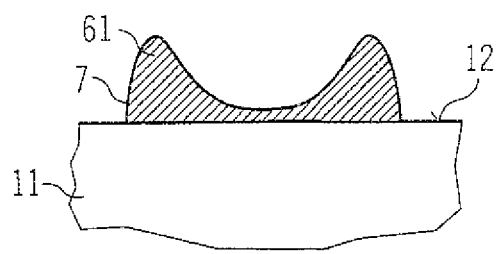

Once the liquid medium 60 has completely volatilized, as shown in FIG. 2D a residue 7 remains on the surface 12 of the transparent layer 11, said residue comprising the material 61. The residue 7 of the individually dried drop 6 has a meniscus-like form with an edge region elevated in comparison with the center. In this case, through a suitable choice of the constituents of the drop 6, the ratio of the height of the residue 7 to the base area thereof on the surface 12 can be greater than or equal to 0.1, and is greater than or equal to 0.15 in the exemplary embodiment shown.

Figure 3:
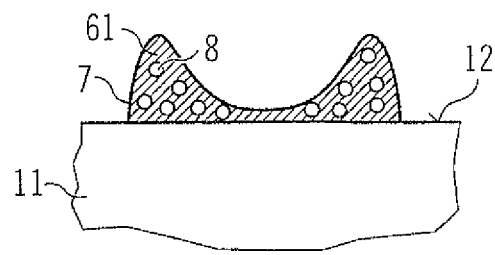
FIG. 3 shows a schematic illustration of a substep of a method step in accordance with a further exemplary embodiment.

FIG. 3 shows a residue 7 in accordance with a further exemplary embodiment, in which a liquid in the form of drops 6 in which the material 61 additionally also comprises scattering particles 8 was applied by spray coating in accordance with FIGS. 1B to 2C. The residue 7 in accordance with FIG. 3 likewise comprises the material 61 in a meniscus-like form, which material simultaneously serves as matrix material for the scattering particles 8. In the exemplary embodiment shown, the scattering particles 8 are embodied as hollow plastic spheres having a size of less than a few hundred nanometers, which have a different refractive index than the material 61.

If a further drop 6 is sprayed onto the surface 12 of the transparent layer 11 in accordance with the previous description, then it can partly cover or at least adjoin, for example the residue 7 in FIG. 2D or 3. As a result, during the drying of said drop 6, on account of the residue 7 already present and the form thereof, an individual meniscus-like form is established which is different than the form of the residue 7 shown. This effect is also additionally intensified by the fact that the further drop can have a different size than the drop applied beforehand. As a result, an irregular arrangement of residues 7 on the surface 12 of the transparent layer 11 can be produced by the spray coating.

Figure 4:
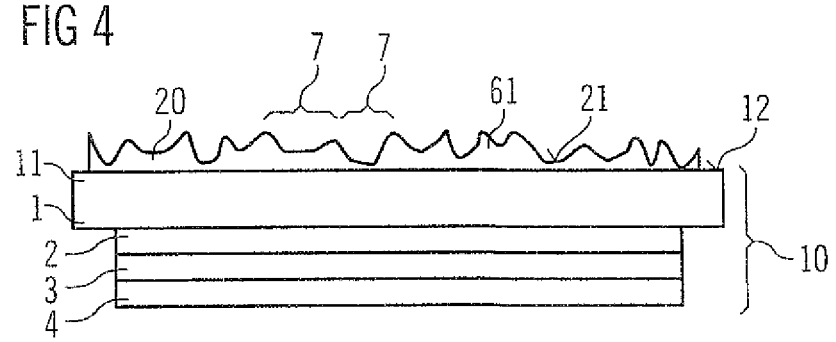
FIG. 4 shows a schematic illustration of an organic radiation-emitting component in accordance with a further exemplary embodiment.

FIG. 4 shows an organic radiation-emitting component having on the surface 12 of the transparent layer 11 a radiation coupling-out layer 20 formed by the individually dried residues 7 of the drops 6 applied by spray coating in accordance with the previous description. In this case, the above-described drying of the residues 7, of which two are identified purely by way of example, gives rise to the surface structure 21 of the radiation coupling-out layer 20, said surface structure being shown purely by way of example. Respectively adjacent or partly overlapping residues 7 form structures having prism- or pyramid-like forms which have, in comparison with other methods mentioned in the general part, a greater irregularity and roughness in the case of an average size of less than 1 micrometer.

In particular, it should be pointed out that here and in the following figures the size of the surface structure 21 is illustrated with an exaggerated size in comparison with the extent of the organic radiation-emitting layer sequence 10, for the sake of clarity.

The radiation coupling-out layer 20 applied by spray coating in this way has a thickness of between 30 nanometers and 30 micrometers, and particularly preferably between 300 nanometers and 3 micrometers, in each case inclusive of the limits.

In the exemplary embodiment shown, the material 61 of the radiation coupling-out layer 20 has a refractive index that is less than or equal to the refractive index of the transparent layer 11 of the organic radiation-emitting layer sequence 10 and greater than the refractive index of air. As a result and by virtue of the irregular and rough surface structure 21 of the radiation coupling-out layer 20, the coupling-out of the electromagnetic radiation generated in the organic functional layer 3 can be significantly increased in comparison with a conventional OLED without the radiation coupling-out layer 20 described here.

If the material 61 additionally comprises scattering particles 8, as shown in FIG. 3, then said scattering particles can act as volume scatter and increase the coupling-out efficiency even further. The scattering particles 8 are likewise irregularly and purely statistically distributed as a result of the spray coating.

As a result of the great irregularity of the surface structure 21 and, if appropriate, as a result of the scattering particles 8, disturbing moiré effects are avoided by means of the radiation coupling-out layer 20 described here, which can enable a great homogeneity of the emitted luminance intensity. Particularly preferably, in this connection the material 61 itself also has an amorphous, vitreous structure.

Figure 5:
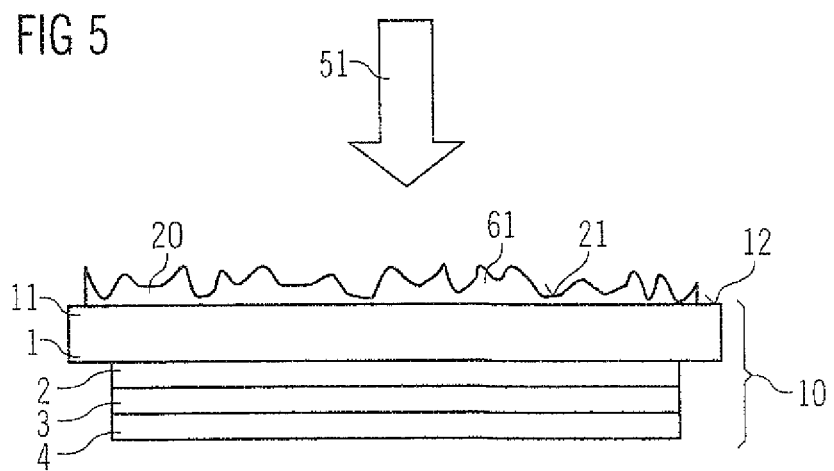
FIG. 5 shows a schematic illustration of a method step in accordance with a further exemplary embodiment.

FIG. 5 shows a further method step in accordance with a further exemplary embodiment, in which the material 61 of the radiation coupling-out layer 20 or of the residues forming the latter is crosslinked. In this case, the material 61 is crosslinked and thereby cured by an external energy input, indicated by the arrow 51, for example in the form of UV or thermal radiation. As an alternative thereto, the energy input can also be effected during method step B in accordance with FIG. 1B and also FIGS. 2A to 2D, such that the residues 7 of the drop 6 are individually cured.

Figure 6:
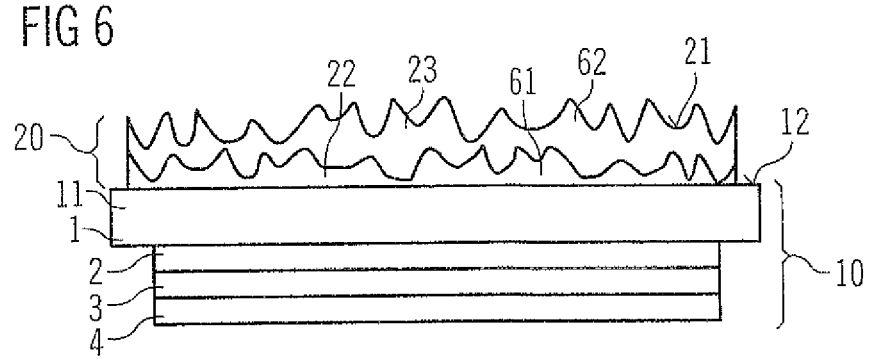
FIGS. 6 and 7 show schematic illustrations of organic radiation-emitting components in accordance with further exemplary embodiments.

FIG. 6 shows an organic radiation-emitting component in accordance with a further exemplary embodiment, which has a radiation coupling-out layer 20 comprising a first layer 22 and a second layer 23. In this case, the first layer 22 comprises a first material 61 and is applied by spray coating in a substep B1 of method step B for example in accordance with the previous description. The second layer 23 comprises a second material 62, which is applied by spray coating on the first layer 22 by means of a second substep B2 of method step B. That surface of the second layer 23 which is remote from the transparent layer 11 has the surface structure 21 of the radiation coupling-out layer 20.

The second material 62 of the second layer 23 has a lower refractive index than the first material 61 of the first layer 22, while the first material 61 has a lower refractive index than the transparent layer 11 of the organic radiation-emitting layer sequence 10. By virtue of such a "refractive index cascade" in conjunction with the respective surface structures of the first layer 22 and the second layer 23, it is possible to reduce the probability of total reflection at interfaces between said layers, as a result of which the coupling-out efficiency can be increased further. In addition to the first layer 22 and the second layer 23, the radiation coupling-out layer 20 can have even further layers which are applied by spray coating on one another and which likewise form a refractive index cascade.

Figure 7:
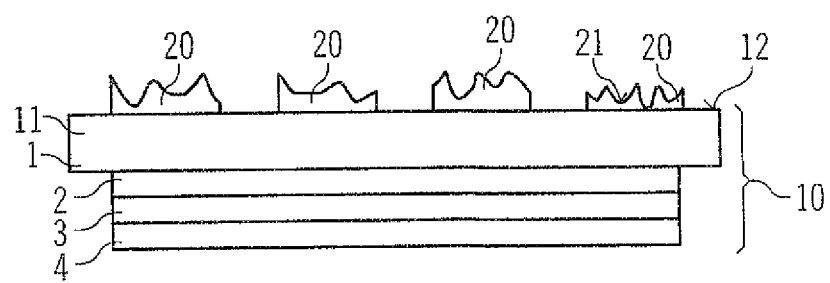

FIG. 7 shows an organic radiation-emitting component in accordance with a further exemplary embodiment, which has a structured radiation coupling-out layer 20. In this case, the drops are applied by spray coating through a shadow mask in method B. As an alternative thereto, the drops can also be applied by spray coating in a large-area fashion and in an unstructured fashion and the dried residues can subsequently be crosslinked through a shadow mask by means of UV light, for example. Uncrosslinked regions of the residues 7 are then subsequently removed.

The organic radiation-emitting layer sequence 10 in the exemplary embodiment shown is embodied as a display comprising individual pixels. The structured radiation coupling-out layer 20 has residues of the drops applied by spray coating only above the pixels, such that the coupling-out of the emitted electromagnetic radiation of each pixel can be optimized without the pixel boundaries being blurred by the surface structure 21 of an unstructured radiation coupling-out layer 20.

FIGS. 8A to 8C show substeps of method step B in a manner similar to that in FIGS. 2A to 2D in accordance with a further exemplary embodiment.

The drops 6 sprayed onto the surface 12, one drop of which is shown by way of example in FIG. 8A, comprise mutually insoluble solutions comprising materials 61 and 62 which are applied by spray coating simultaneously in the form of an emulsion in a liquid material 60, which can comprise an emulsifier, for example.

After impinging on the surface 12 in accordance with FIG. 8B, the mutually insoluble solutions comprising the materials 61 and 62 dry individually and independently of one another. In this case, the liquid medium 60 and also the solvents of the materials 61 and 62 volatilize, as is indicated by the arrows 63.

As is shown in FIG. 8C, each of the regions comprising the material 61 and comprising the material 62 respectively forms its own residue 7, which can have a meniscus-like form as a result of the Marangoni effect during drying for example in accordance with the description above. As a result, it is possible to produce a radiation coupling-out layer which can have laterally alternating optical properties as a result of the described phase separation of the materials 61 and 62.

As an alternative to the exemplary embodiment shown, the mutually insoluble materials 61 and 62 can also be applied by spray coating simultaneously from two different nozzles.

The shown method steps and features of the exemplary embodiments described and of the embodiments described in the general part can furthermore also be combined with one another in order to achieve an optimum coupling-out efficiency through the radiation coupling-out layer 20.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing an organic radiation-emitting component, comprising the steps of:
   A) providing an organic radiation-emitting layer sequence having at least one organic functional layer suitable for emitting electromagnetic radiation during operation, and a transparent layer; and
   B) applying a transparent radiation coupling-out layer having a surface structure on a surface of the transparent layer facing away from the at least one functional layer by means of spray coating,
   wherein, in step B, at least two materials which are insoluble in one another are applied by spraying liquid drops including said at least two materials.

2. The method according to claim 1, wherein in method step B, the radiation coupling-out layer is applied by spray coating in the form of individual liquid drops.

3. The method according to claim 2, wherein in method step B, said individual liquid drops dry individually on the surface of the transparent layer to form the radiation coupling-out layer.

4. The method according to claim 2, wherein in method step B, a crosslinkable material in a liquid phase, a solution, a suspension or a combination thereof is applied in the form of said individual liquid drops, wherein the radiation coupling-out layer is formed by means of drying and/or crosslinking of the material.

5. The method according to claim 2, wherein said individual liquid drops form during drying residues having a prism-like form, a pyramid-like form, a meniscus-like form or a combination thereof.

6. The method according to claim 2, wherein each of said individual liquid drops includes only one of said at least two materials.

7. The method according to claim 1, wherein in method step B, one or a plurality of materials from a group formed by acrylate, silicone, epoxide, polycarbonate, natural plastic is or are applied by spray coating.

8. The method according to claim 1, wherein in method step B, a material comprising scattering particles is applied by spray coating.

9. The method according to claim 1, wherein in method step B, the radiation coupling-out layer is applied in a laterally structured fashion on the surface of the transparent layer.

10. The method according to claim 1, wherein method step B comprises the following substeps:
B1) applying a first material by spray coating, and
B2) applying a second material to the first material by spray coating.

11. The method according to claim 1, wherein each of said at least two materials can be liquids and/or solids.

12. An organic radiation-emitting component, comprising:
an organic radiation-emitting layer sequence having at least one organic functional layer suitable for emitting electromagnetic radiation during operation, and a transparent layer; and
a transparent radiation coupling-out layer on a surface of the transparent layer which is remote from the at least one functional layer,
wherein the transparent radiation coupling-out layer has a first layer comprising a first material and a second layer comprising a second material, and
wherein each of the first and the second layers is formed from residues of a plurality of individually dried liquid drops so that the transparent radiation coupling-out layer has a surface structure formed from residues of a plurality of said individually dried liquid drops.

13. The component according to claim 12, wherein the residues have a size of less than or equal to 1 micrometer.

14. The component according to claim 12, wherein the residues have a prism-like form, a pyramid-like form, a meniscus-like form or a combination thereof.

15. The component according to claim 14, wherein the residues have a height-to-base-area ratio of greater than or equal to 0.1.

16. A method for producing an organic radiation-emitting component, comprising the steps of:
A) providing an organic radiation-emitting layer sequence having at least one organic functional layer suitable for emitting electromagnetic radiation during operation, and a transparent layer; and
B) applying a transparent radiation coupling-out layer having a surface structure on a surface of the transparent layer facing away from the at least one functional layer by means of spray coating,
wherein method step B comprises the following substeps:
B1) applying drops of a liquid first material by spray coating; and
B2) applying drops of a liquid second material to the first material by spray coating.

* * * * *